United States Patent
Ries et al.

(10) Patent No.: US 10,068,795 B2
(45) Date of Patent: Sep. 4, 2018

(54) METHODS FOR PREPARING LAYERED SEMICONDUCTOR STRUCTURES

(71) Applicant: SunEdison Semiconductor Limited (UEN201334164H), Singapore (SG)

(72) Inventors: Michael J. Ries, St. Charles, MO (US); Jeffrey Louis Libbert, O'Fallon, MO (US); Charles R. Lottes, Ballwin, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/119,304

(22) PCT Filed: Jan. 9, 2015

(86) PCT No.: PCT/US2015/010759
§ 371 (c)(1),
(2) Date: Aug. 16, 2016

(87) PCT Pub. No.: WO2015/119742
PCT Pub. Date: Aug. 13, 2015

(65) Prior Publication Data
US 2017/0025307 A1    Jan. 26, 2017

Related U.S. Application Data

(60) Provisional application No. 61/937,035, filed on Feb. 7, 2014.

(51) Int. Cl.
*H01L 21/30* (2006.01)
*H01L 21/46* (2006.01)
(Continued)

(52) U.S. Cl.
CPC ...... *H01L 21/76254* (2013.01); *H01L 24/83* (2013.01); *H01L 21/0455* (2013.01);
(Continued)

(58) Field of Classification Search
CPC ......... H01L 21/76; H01L 21/04; H01L 21/22; H01L 21/26; H01L 21/00
(Continued)

(56) References Cited

U.S. PATENT DOCUMENTS 5,189,500 A     2/1993  Kusunoki
5,374,564 A *  12/1994  Bruel ............... B28D 1/005
                                                  148/DIG. 12
(Continued)

FOREIGN PATENT DOCUMENTS

| EP | 1970942 A1 | 9/2008 |
| FR | 2774510 A1 | 8/1999 |
| FR | 2847075 A1 | 5/2004 |

OTHER PUBLICATIONS

Tong et al., "A "smarter-cut" approach to low temperature silicon layer transfer", Appl. Phys. Lett., vol. 72, No. 1, Jan. 1998.
(Continued)

*Primary Examiner* — Sheikh Maruf
(74) *Attorney, Agent, or Firm* — Armstrong Teasdale LLP

(57) ABSTRACT

Methods for preparing layered semiconductor structures are disclosed. The methods may involve pretreating an ion-implanted donor wafer by annealing the ion-implanted donor wafer to cause a portion of the ions to out-diffuse prior to wafer bonding. The donor structure may be bonded to a handle structure and cleaved without re-implanting ions into the donor structure.

24 Claims, 4 Drawing Sheets

(51) Int. Cl.
  *H01L 21/00* (2006.01)
  *H01L 21/762* (2006.01)
  *H01L 23/00* (2006.01)
  *H01L 21/04* (2006.01)
  *H01L 21/225* (2006.01)
  *H01L 21/265* (2006.01)

(52) U.S. Cl.
  CPC ...... *H01L 21/2253* (2013.01); *H01L 21/2258* (2013.01); *H01L 21/265* (2013.01); *H01L 2224/83054* (2013.01); *H01L 2224/83085* (2013.01); *H01L 2224/83236* (2013.01); *H01L 2224/83893* (2013.01)

(58) Field of Classification Search
  USPC .................................................. 438/458–460
  See application file for complete search history.

(56) References Cited

U.S. PATENT DOCUMENTS

| | | | |
|---|---|---|---|
| 5,436,175 A | 7/1995 | Nakato et al. | |
| 5,909,627 A * | 6/1999 | Egloff | H01L 21/76254 257/E21.568 |
| 6,429,104 B1 | 8/2002 | Auberton-Herve | |
| 6,500,732 B1 * | 12/2002 | Henley | 156/384 |
| 6,534,380 B1 * | 3/2003 | Yamauchi | H01L 21/76254 257/E21.568 |
| 6,544,862 B1 * | 4/2003 | Bryan | H01L 21/76254 257/617 |
| 6,787,885 B2 | 9/2004 | Esser et al. | |
| 6,790,747 B2 | 9/2004 | Henley et al. | |
| 6,809,009 B2 | 10/2004 | Aspar et al. | |
| 6,900,113 B2 * | 5/2005 | Nakano | H01L 21/76254 257/E21.568 |
| 8,163,581 B1 * | 4/2012 | Or-Bach | H01L 31/0725 438/39 |
| 2002/0153563 A1 * | 10/2002 | Ogura | H01L 21/7624 257/347 |
| 2003/0077885 A1 * | 4/2003 | Aspar | H01L 21/76254 438/517 |
| 2003/0082889 A1 * | 5/2003 | Maruyama | H01L 27/1214 438/455 |
| 2003/0162367 A1 * | 8/2003 | Roche | H01L 21/76254 438/460 |
| 2004/0029358 A1 * | 2/2004 | Park | H01L 21/76254 438/458 |
| 2006/0040469 A1 * | 2/2006 | Aga | H01L 21/265 438/458 |
| 2007/0037363 A1 * | 2/2007 | Aspar | H01L 21/76254 438/459 |
| 2008/0286937 A1 * | 11/2008 | Mitani | H01L 21/26506 438/458 |
| 2008/0311686 A1 * | 12/2008 | Morral | H01L 21/26506 438/7 |
| 2011/0177673 A1 * | 7/2011 | Landru | H01L 21/76254 438/459 |
| 2011/0315664 A1 * | 12/2011 | Bruel | H01L 21/76254 219/121.35 |
| 2012/0129325 A1 * | 5/2012 | Adibi | C23C 14/042 438/513 |

OTHER PUBLICATIONS

Esser et al., "Improved Low-Temperature Si—Si Hydrophilic Wafer Bonding", Journal of the Electrochemical Society, 150(3) G228-G231 (2003).

Ventosa et al., "Prebonding Thermal Treatment in Direct Si-Si Hydrophilic Wafer Bonding", Journal of the Electrochemical Society, 156(11) H818-H823 (2009).

Hurley et al., "Ion implantation of hydrogen and helium into silicon wafers for layer transfer in devices", Vacuum 78 (2005) 167-175.

Hurley et al., "Studies of co-implanted helium and hydrogen with an intermediate annealing step for thermal splitting of bonded silicon to oxide-coated wafers," Vacuum 76 (2004) 291-297.

* cited by examiner

METHODS FOR PREPARING LAYERED SEMICONDUCTOR STRUCTURES

CROSS-REFERENCE TO RELATED APPLICATION

This application is a 35 U.S.C. § 371 National Stage application of International Application No. PCT/US2015/010759, filed Jan. 9, 2015, which claims the benefit of U.S. Provisional Application No. 61/937,035, filed Feb. 7, 2014, both of which are incorporated herein by reference in their entirety.

FIELD OF THE DISCLOSURE

The present disclosure relates to methods for preparing layered semiconductor structures and, in particular, to methods which involve pretreating an ion-implanted donor wafer by annealing the ion-implanted donor wafer to cause a portion of the ions to out-diffuse prior to wafer bonding.

BACKGROUND

Multi-layered structures comprising a device layer with a device quality surface and a supporting substrate are useful for a number of different purposes. Multi-layered structures comprising a device quality layer bonded to a substrate may be fabricated or manufactured in a number of ways. For example, a multi-layered structure may be formed in which a donor wafer is bonded to a handle wafer with a dielectric layer such as silicon dioxide disposed between the donor wafer and handle wafer. The donor wafer may be ground, etched or cleaved to leave a relatively thin device layer on the dielectric layer. Other processes involve direct layer transfer in which an implanted wafer is bonded directly to the substrate, subjected to a low temperature anneal, and cleaved thermally and/or mechanically to result in a thin layer on the surface of the substrate.

The quality of the bonds that form during bonding of the donor structure to the handle structure impacts the performance and quality of the resulting device. Thermal voids may form at the bond interface during subsequent bond treatment processes which cause incomplete layer transfer during subsequent cleaving and result in commercially unacceptable wafer products.

A continuing need exists for method for preparing multi-layered structures with improved bonding and/or which include a reduced amount of thermal voids at the bond interface of the structure.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for pretreating a structure for use during preparation of a layered semiconductor structure. The structure has a bonding surface for bonding to a second structure. Ions are implanting into the structure to form a cleave plane in the structure. The ion-implanted structure is annealed to cause a portion of the ions to out-diffuse. The bonding surface of the ion out-diffused structure is activated.

Another aspect of the present disclosure is directed to a method for preparing a layered semiconductor structure having a device layer and a handle layer. Ions are implanting into a donor structure to form a cleave plane in the donor structure. The donor structure has a bonding surface for bonding to a second structure. The ion-implanted structure is annealed to cause a portion of the ions to out-diffuse. The bonding surface of the ion out-diffused structure is activated. The activated bonding surface of the ion out-diffused donor structure is bonded to a bonding surface of a handle structure to form a bonded structure. The bonded structure is cleaved at the cleave plane such that a portion of the donor structure remains bonded to the handle structure to form the device layer.

A further aspect of the present disclosure is directed to a method for preparing a layered semiconductor structure having a device layer and a handle layer. Ions are implanted into a donor structure to form a cleave plane in the donor structure. The donor structure has a bonding surface for bonding to a handle structure. The ion-implanted donor structure is annealed to cause a portion of the ions to out-diffuse and to form a post-annealed ion profile in the donor structure. The bonding surface of the annealed donor structure having the post-annealed ion profile is bonded to a bonding surface of a handle structure to form a bonded structure. The bonded structure is cleaved at the cleave plane such that a portion of the donor structure remains bonded to the handle structure to form the device layer.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
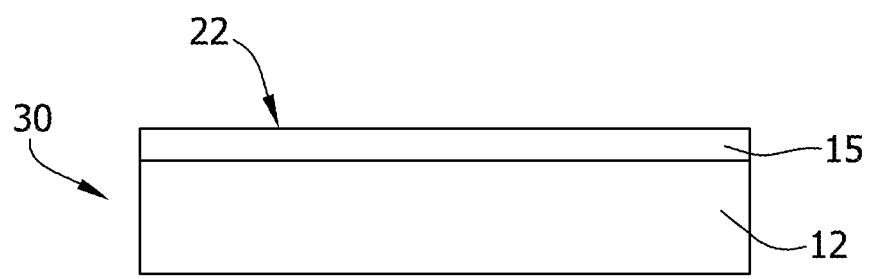
FIG. 1 is a cross-section view of a donor structure having donor wafer with a dielectric layer thereon.

In accordance with embodiments of the present disclosure, a layered semiconductor structure may be produced by pretreating a structure (e.g., donor structure) prior to bonding with a second structure. The donor structure may be pretreated by implanting with ions (e.g., hydrogen and/or helium) to form a cleave plane in the structure. The ion-implanted structure is then annealed prior to bonding to cause a portion of the ions to out-diffuse from the structure. Compared to conventional methods for preparing a multi-layered structure, the pretreatment method described herein has several advantages. By out-diffusing ions from the structure prior to bonding, the number of thermal voids at the bond interface may be reduced. In some embodiments, the resulting bonded structure may be cleaved without altering the ion-profile in the donor structure after completion of the ion out-diffusion anneal (i.e., without a performing an ion re-implantation subsequent to the ion out-diffusion anneal). In such embodiments, process time and cost in preparing the multi-layered structure may be reduced. The ion out-diffusion method may be particularly useful in preparing devices which use relatively thin dielectric layers (e.g., less than about 500 Å) such as fully-depleted silicon on insulator devices.

Multi-layered structures and, in particular, silicon on insulator structures and methods for producing silicon on insulator structures are generally known by those skilled in the art (see, for example, U.S. Pat. Nos. 5,189,500; 5,436,175 and 6,790,747, each of which is incorporated herein by reference for all relevant and consistent purposes). In an exemplary process for making a multi-layered structure, two separate structures are prepared, bonded together along a bond interface, and then delaminated (i.e., cleaved) along a separation plane (i.e., "cleave plane") that is different from the bond interface and which has been formed via an implantation technique. One structure is typically referred to as the "handle" structure and the other is typically referred to as the "donor" structure. After processing, the resulting layered semiconductor structure includes a device layer and a handle layer that supports the device layer. In some embodiments (e.g., SOI structures), the layered semiconductor structure includes a further intervening layer disposed between the handle layer and device layer.

The donor structure includes a donor wafer and may optionally include a dielectric layer deposited on the surface of the donor wafer. The handle structure may include a handle wafer and may optionally include a dielectric layer on the surface of the handle wafer. In this regard, the bonded structures and methods for preparing the bonded structures may be described herein as being formed from a donor structure that includes a dielectric layer and from a handle structure that includes only a handle wafer and not a dielectric layer. However, it should be understood that the dielectric layer may be grown or deposited on the handle wafer alternatively or in addition to growing or depositing the dielectric layer on the donor wafer and that these structures may be bonded in any of the various arrangements without limitation. Reference herein to the dielectric layer being disposed on the handle wafer alone should not be considered in a limiting sense.

I. Donor Structure Pretreatment

According to embodiments of the present disclosure, a donor structure (e.g., donor wafer with dielectric layer disposed thereon) is pretreated for use during preparation of a layered semiconductor structure. The donor structure may include a donor wafer composed of silicon, germanium, silicon germanium, gallium nitride, aluminum nitride, gallium arsenide, indium gallium arsenide and combinations thereof. In some embodiments, the donor wafer is composed of single crystal silicon.

Referring to FIG. 1, the donor structure 30 includes a dielectric layer 15 (e.g., a silicon oxide and/or silicon nitride layer) deposited on a polished front surface 42 of a donor wafer 12. The dielectric layer 15 may be applied according to any known technique in the art, such as thermal oxidation, wet oxidation, thermal nitridation or a combination of these techniques. Generally speaking, the dielectric layer 15 is grown to a substantially uniform thickness sufficient to provide the desired insulating properties in the final structure. Typically, however, the dielectric layer has a thickness of less than about 500 nm, less than about 300 nm, less than about 200 nm, less than about 150 nm or even less than about 100 nm (e.g., from about 50 nm to about 500 nm or from about 50 nm to about 200 nm).

In some embodiments, a relatively thin (e.g., less than about 500 Å) dielectric layer is used. The thickness of the dielectric layer may be less than about 500 Å or less than about 400 Å, less than about 300 Å, less than about 200 Å or even less than about 100 Å (e.g., from about 30 Å to about 500 Å, from about 75 Å to about 500 Å, from about 100 Å to about 500 Å or from about 75 Å to about 300 Å). In some embodiments, the dielectric layer 15 is a native $SiO_2$ layer (i.e., a $SiO_2$ layer that forms upon exposure of the wafer 15 to the ambient atmosphere). Such native $SiO_2$ layers may have a thickness of from about 10 Å to about 20 Å.

The dielectric layer 15 may be any electrically insulating material suitable for use in a SOI structure, such as a material comprising $SiO_2$, $Si_3N_4$, aluminum oxide, or magnesium oxide. In some embodiments, the dielectric layer 15 is $SiO_2$ (i.e., the dielectric layer consists essentially of $SiO_2$). However, it is to be noted that in some instances, it may alternatively be preferable to use a material for the dielectric layer which has a melting point which is higher than the melting point of pure $SiO_2$ (i.e., higher than about 1700° C.). Examples of such materials are silicon nitride ($Si_3N_4$), aluminum oxide, and magnesium oxide.

In this regard it should be understood that, while the layered semiconductor structures may be described herein as having a dielectric layer, in some embodiments the dielectric layer is eliminated (i.e., a dielectric layer is not deposited on the donor wafer or handle wafer prior to bonding) and the handle wafer and donor wafer are "direct bonded." Reference herein to such dielectric layers should not be considered in a limiting sense. Any one of a number of techniques known to those of skill in the art may be used to produce such direct bonded structures. In such embodiments, the bonding surface of the donor structure is the surface of the donor wafer itself.

Figure 2:
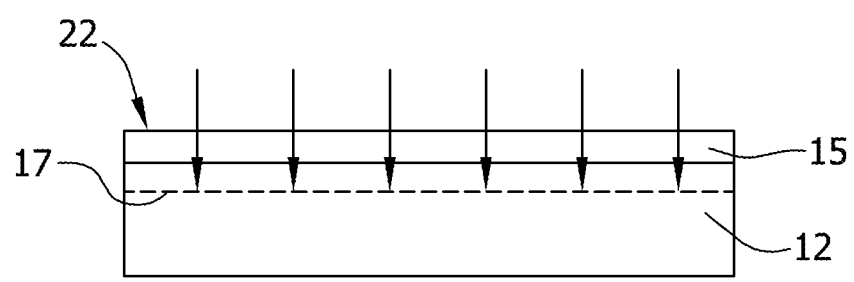
FIG. 2 is a cross-section view of the donor structure during ion implantation thereon.

In accordance with embodiments of the present disclosure and as shown in FIG. 2, ions (e.g., hydrogen atoms, helium atoms or a combination of hydrogen and helium atoms) are implanted at a substantially uniform specified depth beneath the front surface 22 of the donor structure to define a cleave plane 17. It should be noted, that when helium and hydrogen ions are co-implanted into the structure to form the cleave plane, they may be implanted concurrently or sequentially.

Ion implantation may be achieved using means known in the art. For example, this implantation may be achieved in a manner similar to the process disclosed in U.S. Pat. No. 6,790,747. Implantation parameters may include, for example, implantation of ions to a total dose of about $1\times10^{15}$ to about $5\times10^{16}$ ions/cm² at a total energy of, for example, about 20 to about 125 keV (e.g., $H_2^+$ may be implanted at an energy of 20 keV and a dose of $2.4\times10^{16}$ ions/cm²). When a combination of ions is used, the dose may be adjusted between the combination of ions accordingly (e.g., $He^+$ may be implanted at an energy of 36 keV and a dose of $1\times10^{16}$ ions/cm² followed by $H_2^+$ implanted at an energy of 48 keV and a dose of $5\times10^{15}$ ions/cm²).

While ion implantation may be described herein as occurring subsequent to formation of the dielectric layer 15 on the surface of the donor wafer 12, in some embodiments, ions are implanted prior to deposition of the dielectric layer 15. When implantation is performed prior to deposition of the dielectric layer 15, the subsequent growth or deposition of the dielectric layer on the donor wafer is suitably performed at a temperature low enough to prevent premature separation or cleaving along plane 17 in the donor layer (i.e., prior to the wafer bonding process step). The separation or cleaving temperature is a complex function of the implanted species, implanted dose, and implanted material. However, typically, premature separation or cleaving may be avoided by maintaining a deposition or growth temperature below about 500° C. In embodiments in which ion implantation occurs prior to deposition of the dielectric layer, the pre-bond anneal described herein may occur during the deposition process itself or may occur separate from the deposition process (i.e., before or after deposition). In such embodiments, the sequence of the pre-bond anneal and dielectric layer deposition may depend on the extent (if any) of ion out diffusion that occurs during the deposition (e.g., may depend on the temperature at which the dielectric layer is deposited).

After ion-implantation, the ion-implanted structure is annealed prior to bonding to cause a portion of the ions to out-diffuse from the structure. The anneal allows ions near the bond interface to diffuse from the structure thereby reducing thermal voids at the bond interface of the resulting bonded structure.

The pre-bond anneal of the ion-implanted structure is believed to cause cracks to form at the cleave plane 17 which allows for layer transfer (i.e., cleave) to occur during subsequent thermal or mechanical cleaving operations. The pre-bond anneal of the ion-implanted structure also allows for solid-state diffusion of hydrogen and/or helium from the bonding surface into the ambient thereby decreasing the concentration of hydrogen and helium at the bonding surface. It should be noted that the methods of the present disclosure should not be limited to a particular mode or mechanism of action (i.e., diffusion) and the methods include any pre-bond anneal than may result in reduction of thermal voids and/or improved bonding.

For structures comprising silicon (e.g., silicon wafers optionally having a dielectric layer deposited thereon), the ion-implanted structure may be pre-bond annealed at a temperature of at least about 150° C. and less than a temperature at which the surface of the ion-implanted structure begins to blister. Ion-implanted structures comprising silicon may blister at a temperature of about 300° C., about 350° C., about 400° C., about 450° C. or even about 500° C. The temperature at which blistering occurs may depend on the implant conditions and may be determined by conducting anneals at successively higher temperatures and inspecting the wafer for blistering. In some embodiments, the pre-bond anneal is performed at a temperature of at least about 150° C., at least about 200° C., at least about 250° C., less than about 500° C., less than about 450° C., less than about 400° C., less than about 350° C. or less than about 300° C. (e.g., from about 150° C. to about 500° C., from about 150° C. to about 400° C., from about 150° C. to about 300° C. or from about 250° C. to about 300° C.).

The duration of the anneal may vary depending on the temperature of the anneal with higher temperature anneals corresponding to shorter anneals. In some embodiments, the anneal is performed for at least about 30 seconds, at least about 1 minute, at least about 5 minutes, at least about 10 minutes, at least about 20 minutes or longer (e.g., from about 1 to about 30 minutes or from about 1 to about 20 minutes). It should be noted that the pre-bond anneals described herein are not limited to a particular duration unless stated otherwise.

The pre-bond anneal of the donor structure causes ions (e.g., hydrogen and/or helium) to out-diffuse and creates a post-annealed ion profile in which the donor structure includes a reduced amount of implanted ions near the bonding surface of the structure. In some embodiments, the post-annealed ion profile is not altered prior to bonding of the donor structure to a handle structure as described below. This post-annealed ion profile may be maintained by not implanting further ions (e.g., hydrogen or helium) into the wafer after the ion-implanted structure is pre-bond annealed (i.e., ion re-implanting is not performed) as in accordance with some embodiments of the present disclosure.

Prior to bonding, the surface 22 of the ion out-diffused donor structure may optionally undergo cleaning and/or a brief etching, planarization, or activation to prepare the bonding surface (i.e., the surface of the dielectric layer when present or the surface of the wafer when no dielectric layer is used) for bonding using techniques known in the art. The activation process may be a chemical activation or a physical activation. Chemical activation processes may involve exposing the bonding surface of the ion out-diffused structure to water or water vapor to adsorb water onto the bonding surface. Physical activation processes may include exposing the bonding surface to a plasma. In some embodiments, the bonding surface of the ion out-diffused structure is activated by exposing the bonding surface to a plasma and subsequently adsorbing water onto the bonding surface.

II. Bonding of the Handle Structure and Donor Structure

The handle structure includes a handle wafer that may be obtained from any material common in the art for preparing multi-layered structures, such as silicon, silicon carbide, sapphire, germanium, silicon germanium, gallium nitride, aluminum nitride, gallium arsenide, indium gallium arsenide, quartz and combinations thereof. The handle structure 10 (FIG. 3) may include a dielectric layer deposited on a handle wafer or, as in other embodiments, consists only of a donor wafer (i.e., does not include a dielectric layer).

The handle wafer and donor wafer may be single crystal silicon wafers and may be single crystal silicon wafers which have been sliced from a single crystal ingot grown in accordance with conventional Czochralski crystal growing methods. The present application may refer to a specific type of multi-layered structure, i.e., silicon on insulator ("SOI") structures, for illustrative purposes.

In this regard, it should be noted that the handle structure and/or the donor structure used in accordance with the present disclosure may be any diameter suitable for use by those of skill in the art including, for example, 200 mm, 300 mm, greater than 300 mm or even 450 mm diameter wafers.

Figure 3:
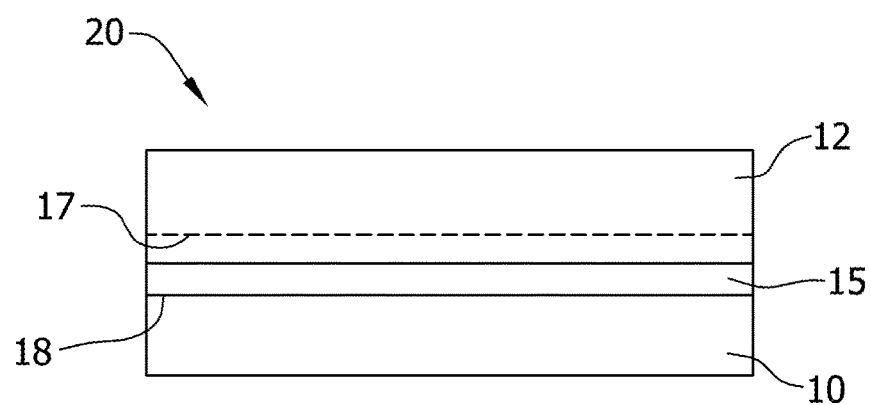
FIG. 3 is a cross-section view of the donor structure and bonded to a handle structure.

Referring now to FIG. 3, the front surface of the dielectric layer 15 of the donor structure is bonded to the front surface of the handle structure 10 to form a bonded wafer 20 through a hydrophilic bonding process. The dielectric layer 15 and handle structure 10 may be bonded together while performing a surface activation by exposing the surfaces of the structures to a plasma containing, for example, oxygen or nitrogen. The wafers are then pressed together and a bond at the bond interface 18 is formed there between.

Prior to bonding, the surfaces of the handle structure and/or donor structure (as noted above) may optionally undergo cleaning and/or a brief etching, planarization, or activation (physical or chemical). In some instances, therefore, the handle structure or donor structure may be subjected to one or more of the following procedures in order to obtain, for example, a low surface roughness (e.g., a roughness of less than about 0.5 nm root mean square (RMS)) prior to bonding: (i) planarization by, for example, CMP and/or (ii) cleaning by, for example, a wet chemical cleaning procedure, such as a hydrophilic surface preparation process (e.g., an RCA SC-1 clean process wherein the surfaces are contacted with a solution containing ammonium hydroxide, hydrogen peroxide, and water at a ratio of, for example, 1:2:50 at about 65° C. for about 20 minutes, followed by a deionized water rinse and drying). One or both of the surfaces may also optionally be subjected to an activation step (e.g., plasma activation) after, or instead of, the wet cleaning process to increase the resulting bond strength. The plasma environment may include, for example, oxygen, ammonia, argon, nitrogen, diborane, or phosphine.

Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Typically, however, wafer bonding is achieved by contacting the surface of the dielectric layer and the handle wafer at a reduced pressure (e.g., about 50 mTorr) and at room temperature, followed by heating at an elevated temperature (e.g., at least about 200° C., at least about 300° C., at least about 400° C., or even at least about 500° C.) for a sufficient period of time (e.g., at least about 10 seconds, at least about 1 minute, at least about 15 minutes, at least about 1 hour or even at least about 3 hours). For example, the heating may take place at about 350° C. for about 1 hour. The resulting interface may have a bond strength that is greater than about 500 mJ/m$^2$, greater than about 1000 mJ/m$^2$, greater than about 1500 mJ/m$^2$, or even greater than about 2000 mJ/m$^2$. The elevated temperatures cause the formation of covalent bonds between the adjoining surfaces of the donor structure and the handle structure, thus solidifying the bond between the donor structure and the handle structure. During heating or annealing of the bonded structure, the ions earlier implanted in the donor wafer weaken the cleave plane. A portion of the donor wafer is then separated (i.e., cleaved) along the cleave plane from the bonded structure to form the layered semiconductor structure as described below.

In some embodiments, the donor structure that is bonded to the handle structure includes the post-annealed ion profile of the donor structure (i.e., the ion profile is not altered subsequent to the ion out-diffusion anneal of the donor structure by re-implanting ions such as hydrogen or helium). The post-annealed ion profile may include the post-annealed profile of hydrogen and/or helium in the donor structure.

III. Bonded Structure Cleaving

Figure 4:
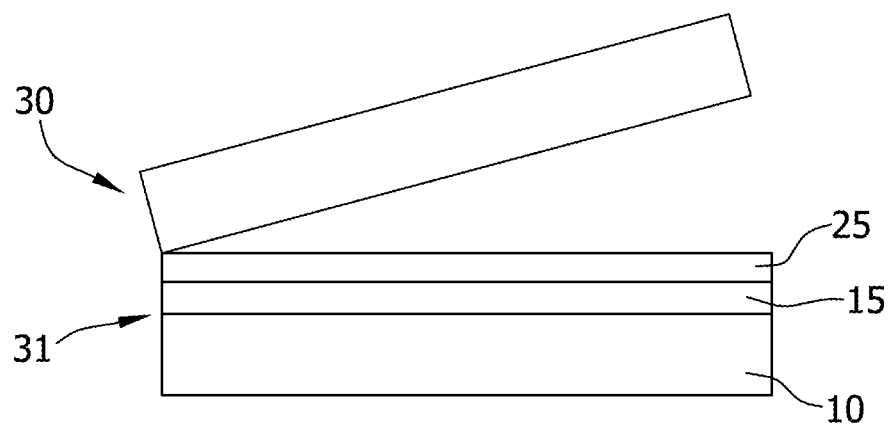
FIG. 4 is a cross-section view of a layered semiconductor structure upon cleaving the donor structure at the cleave plane.

After the bond interface has been formed, the resulting bonded structure is subjected to conditions sufficient to induce a fracture along the separation or cleave plane within the donor wafer (FIG. 4). Generally speaking, this fracture may be achieved using techniques known in the art, such as thermally and/or mechanically induced cleaving techniques. In some embodiments, fracturing is achieved by annealing the bonded structure at a temperature of at least about 200° C., at least about 300° C., at least about 400° C., at least about 500° C., at least about 600° C., at least about 700° C. or even at least about 800° C. (the temperature being in the range of, for example, about 200° C. to about 800° C., or from about 250° C. to about 650° C.) for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions.

In this regard it is to be noted that in an alternative embodiment, this separation may be induced or achieved by means of mechanical force, either alone or in addition to annealing. For instance, the bonded structure may be placed in a fixture in which mechanical force is applied perpendicular to the opposing sides of the bonded structure in order to pull a portion of the donor structure apart from the bonded structure. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor structure from the bonded structure, thus forming a layered semiconductor structure.

Referring to FIG. 4, upon separation, two structures 30, 31 are formed. Since the separation of the bonded structure 20 occurs along the cleave plane 17 in the donor structure 12 (FIG. 3), a portion of the donor structure remains part of both structures (i.e., a portion of the donor wafer is transferred along with the dielectric layer). Structure 30 comprises a portion of the donor wafer. Structure 31 is the layered semiconductor structure and includes a handle layer 10, intervening layer 15 and device layer 25 (the portion of the donor wafer remaining after cleaving) disposed atop the intervening layer 15. In embodiments in which the donor structure and handle structure both include a dielectric layer, the dielectric layers combine to form the intervening layer 25. The cleave surface of the layered semiconductor structure (i.e., the thin device layer of the donor wafer) has a rough surface that may be smoothed by additional processing. The structure 31 may be subjected to additional processing to produce a device layer surface having desirable features for device fabrication thereon.

In some embodiments, the device layer 25 is less than about 200 nm thick or even less than about 100 nm thick. In some applications such as in production of fully-depleted SOI structures, structures with a device layer thickness of less than about 100 nm, less than about 50 nm, less than about 30 nm or even less than about 10 nm (e.g., from about 1 nm to about 200 nm, from about 50 nm to about 200 nm or from about 1 nm to about 10 nm) may be prepared.

In some embodiments of the present disclosure, ions are not implanted into the ion out-diffused donor structure between the post-bond anneal and cleaving of the bonded structure.

EXAMPLES

The processes of the present disclosure are further illustrated by the following Examples. These Examples should not be viewed in a limiting sense.

Example 1: Effect of Pretreatment of Donor Structure on Incidence of Thermal Voids Donor structures having a $SiO_2$ layer disposed on a single crystal silicon wafer were implanted with helium at an energy of 21 keV and a dose of $0.7 \times 10^{16}$ ions/cm$^2$ followed by hydrogen at an energy of 32 keV and a dose of $0.35 \times 10^{16}$ ions/cm$^2$. The ion-implanted wafers were then annealed to out-diffuse ions at variable temperatures and times. The wafers were not re-implanted with hydrogen or helium after the anneal. The wafers were cleaned prior to plasma activation and bonding. The bonding surfaces of the donor and handle structures were plasma activated for 45 seconds.

Bonding occurred at room temperature. After bonding, the bonded structure was annealed in a 350° C. furnace for 30, 45 or 60 minutes. The wafers were mechanically cleaved at room temperature by use of suction cups and a mechanical wedge to initiate propagation of the cleave. The number of thermal voids that existed after cleaving were counted by transmitting infrared light through the bonded structure. The results of each run are shown in Table 1 below.

TABLE 1

Ion Out-Diffusion Runs and Resulting Thermal Void Counts

| Ion Out-Diffusion Anneal Time (minutes) | Ion Out-Diffusion Anneal Temp (° C.) | Bond Treatment Time (minutes) | Thermal Voids |
|---|---|---|---|
| 60 | 250 | 30 | 1 |
| 60 | 250 | 45 | 2 |
| 60 | 275 | 30 | 1 |
| 60 | 275 | 60 | 5 |
| 20 | 275 | 30 | 1 |
| 20 | 275 | 45 | 2 |
| 30 | 300 | 30 | 2 |
| 30 | 300 | 60 | 4 |
| 10 | 300 | 30 | 13 |
| 10 | 300 | 45 | 22 |
| None | None | 30 | Very Many |
| None | None | 60 | Very Many |

As may be seen from Table 1, the pre-bond ion out-diffusion anneals reduced the formation of thermal voids. Further, the wafers were able to be cleaved without re-implantation of hydrogen or helium into the wafers.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for pretreating a structure for use during preparation of a layered semiconductor structure, the structure having a bonding surface for bonding to a second structure, the structure being within an ambient, the method comprising:
    implanting ions into the structure to form a cleave plane in the structure;
    annealing the ion-implanted structure to cause a portion of the ions to out-diffuse from the structure and into the ambient to reduce thermal voids formed at the bonding surface during bonding of the structure to a second structure;
    activating the bonding surface of the ion out-diffused structure by physical or chemical activation of the bonding surface.

2. The method as set forth in claim 1 wherein the bonding surface is activated by exposing the bonding surface to a plasma.

3. The method as set forth in claim 1 wherein the bonding surface is chemically activated.

4. The method as set forth in claim 1 wherein the bonding surface is activated by exposure to water or water vapor to adsorb water onto the bonding surface.

5. The method as set forth in claim 1 wherein the bonding surface is activated by exposing the bonding surface to a plasma and subsequently adsorbing water onto the bonding surface.

6. The method as set forth in claim 1 wherein helium and hydrogen ions are co-implanted into the structure to form the cleave plane.

7. The method as set forth in claim 1 wherein the ion-implanted structure is annealed at a temperature of at least about 150° C. and less than about 500° C.

8. The method as set forth in claim 1 wherein the ion-implanted structure is annealed for at least about 30 seconds.

9. The method as set forth in claim 1 wherein the structure includes a wafer composed of silicon, silicon carbide, sapphire, germanium, silicon germanium, gallium nitride, aluminum nitride, gallium arsenic, indium gallium arsenic, phosphorous, quartz and combinations thereof.

10. The method as set forth in claim 1 wherein the structure includes a single crystal silicon wafer.

11. The method as set forth in claim 1 further comprising depositing a dielectric layer on the ion-implanted structure, the ion out-diffusion anneal occurring during the deposition step.

12. The method as set forth in claim 1 further comprising depositing a dielectric layer on the ion-implanted structure, the ion out-diffusion anneal occurring separate from the deposition step.

13. The method as set forth in claim 1 wherein the structure comprises a dielectric layer disposed on a wafer, the surface of the dielectric layer being the bonding surface.

14. The method as set forth in claim 1 wherein the structure does not include a dielectric layer.

15. The method as set forth in claim 1 wherein ions are not implanted into the structure after the annealing step.

16. The method as set forth in claim 1 further comprising depositing a dielectric layer on a wafer prior to the implantation step.

17. The method as set forth in claim 1 further comprising depositing a dielectric layer on a wafer subsequent to the implantation step.

18. A method for preparing a layered semiconductor structure comprising a device layer and a handle layer, method comprising:
    implanting ions into a donor structure to form a cleave plane in the donor structure, the donor structure having a bonding surface for bonding to a handle structure;
    annealing the ion-implanted donor structure to cause a portion of the ions to out-diffuse from the structure and to form a post-annealed ion profile in the donor structure in which thermal voids formed at the bonding surface are reduced during bonding of the donor structure to a handle structure;

bonding the bonding surface of the annealed donor structure having the post-annealed ion profile to a bonding surface of the handle structure to form a bonded structure; and cleaving the bonded structure at the cleave plane such that a portion of the donor structure remains bonded to the handle structure to form the device layer.

19. The method as set forth in claim 18 comprising co-implanting helium and hydrogen ions into the donor structure to form the cleave plane in the donor structure.

20. The method as set forth in claim 18 comprising:

activating the bonding surface of the annealed donor structure, the activation occurring without a cleave of the annealed donor structure; and activating the bonding surface of the handle structure.

21. The method as set forth in claim 18 wherein at least one of the donor structure and handle structure comprises a native $SiO_2$ layer prior to bonding, the native $SiO_2$ layer forming at least a portion of an intervening layer disposed between the device layer and the handle layer.

22. The method as set forth in claim 18 wherein the donor structure comprises a donor wafer that includes the donor structure bonding surface and the handle structure comprises a handle wafer that includes the handle structure bonding surface, the donor wafer being directly bonded to the handle wafer.

23. The method as set forth in claim 18 wherein the layered semiconductor structure is a silicon-on-insulator structure.

24. The method as set forth in claim 1 wherein activating the bonding surface of the ion out-diffused structure occurs without cleaving the out-diffused structure.

* * * * *